United States Patent
Niwa et al.

(10) Patent No.: US 11,294,521 B2
(45) Date of Patent: Apr. 5, 2022

(54) TOUCH SENSOR AND DISPLAY DEVICE USING SAME

(71) Applicant: PANASONIC INTELLECTUAL PROPERTY MANAGEMENT CO., LTD., Osaka (JP)

(72) Inventors: Hiromitsu Niwa, Osaka (JP); Kenji Shibata, Osaka (JP); Akifumi Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 17/051,380

(22) PCT Filed: Jan. 17, 2019

(86) PCT No.: PCT/JP2019/001297
§ 371 (c)(1),
(2) Date: Oct. 28, 2020

(87) PCT Pub. No.: WO2019/211931
PCT Pub. Date: Nov. 7, 2019

(65) Prior Publication Data
US 2021/0048923 A1 Feb. 18, 2021

(30) Foreign Application Priority Data
May 1, 2018 (JP) .............................. JP2018-088055

(51) Int. Cl.
*G06F 3/044* (2006.01)
*H05K 1/02* (2006.01)
(Continued)

(52) U.S. Cl.
CPC ........... *G06F 3/0445* (2019.05); *H05K 1/028* (2013.01); *H05K 1/0254* (2013.01); *H05K 1/189* (2013.01);
(Continued)

(58) Field of Classification Search
CPC .. G06F 3/04164; G06F 3/0445; G06F 3/0446; G06F 1/1626; G06F 1/1656;
(Continued)

(56) References Cited

U.S. PATENT DOCUMENTS 8,493,345 B2 * 7/2013 Anno ..................... G06F 3/0443
345/173
8,564,550 B2 * 10/2013 Hashimoto ........... G06F 3/0416
345/173
(Continued)

FOREIGN PATENT DOCUMENTS

JP 2015069609 A * 4/2015 ............. G06F 3/041
JP 6146998 B2 6/2017

OTHER PUBLICATIONS

Machined English Translation for JP 2015069609A; Jan. 5, 2022; pp. 1-8 (Year: 2022).*
(Continued)

*Primary Examiner* — Jimmy H Nguyen
(74) *Attorney, Agent, or Firm* — McDermott Will & Emery LLP

(57) ABSTRACT

In a touch sensor, a wiring board has signal line portions electrically connected to a first sensor terminal of a first sensor board at a first end; a ground portion electrically insulated from the signal line portions; and an insulating layer covering the ground portion. The insulating layer has a plurality of through holes for passing through the insulating layer in a thickness direction of the wiring board and exposing the ground portion therethrough. The plurality of
(Continued)

through holes are arranged at intervals. A line segment connecting two through holes of the plurality of through holes intersects the plurality of signal line portions.

20 Claims, 20 Drawing Sheets

(51) Int. Cl.
*H05K 1/18* (2006.01)
*G02F 1/1333* (2006.01)

(52) U.S. Cl.
CPC .... *G02F 1/13338* (2013.01); *G02F 1/133308* (2013.01); *H05K 2201/10151* (2013.01)

(58) Field of Classification Search
CPC ... G06F 1/1643; G06F 1/1658; H05K 1/0254; H05K 1/028; H05K 1/189; H05K 2201/10151; G02F 1/133308; G02F 1/13338

USPC .......................................................... 345/174
See application file for complete search history.

(56) References Cited

U.S. PATENT DOCUMENTS

2014/0177176 A1    6/2014   Torii et al.
2017/0123570 A1*   5/2017   Maruyama .......... G06F 3/04164

OTHER PUBLICATIONS

Interational Search Report and Written Opinion issued in International Patent Application No. PCT/JP2019/001297, dated Apr. 9, 2019; with partial English translation.
Extended European Search Report issued in counterpart European Patent Application No. 19795964.6, dated May 20, 2021.

* cited by examiner

TOUCH SENSOR AND DISPLAY DEVICE USING SAME

CROSS-REFERENCE OF RELATED APPLICATIONS

This application is the U.S. National Phase under 35 U.S.C. § 371 of International Patent Application No. PCT/JP2019/001297, filed on Jan. 17, 2019, which in turn claims the benefit of Japanese Application No. 2018-088055, filed on May 1, 2018, the entire disclosures of which Applications are incorporated by reference herein.

TECHNICAL FIELD

The present invention relates to a touch sensor and a display device using the same.

BACKGROUND ART

A touch sensor, such as that disclosed in Patent Document 1, has been typically known.

Patent Document 1 discloses a touch sensor including a sensor board in which a sensor electrode and a routing line electrically connected to the sensor electrode are formed, and a signal wiring member electrically connected to the routing line with a connection portion mechanically connected to a part of the sensor board.

The signal wiring member has a signal line and a ground wiring line. The signal wiring member has an electric conductor exposing portion in which an electric conductor is exposed between a connection portion and an outline of the touch sensor. The electric conductor exposing portion is non-electroconductive with the signal line and electroconductive with the ground wiring line. The electric conductor exposing portion has a front-side electric conductor exposing portion in which the electric conductor is exposed on a front side of the touch sensor, and a back-side electric conductor exposing portion in which the electric conductor is exposed on a layer of a back side of the front-side electric conductor exposing portion, and the electric conductor is electrically connected to the front-side electric conductor exposing portion.

CITATION LIST

Patent Documents

Patent Document 1: Japanese Patent No. 6146998

SUMMARY OF THE INVENTION

Technical Problem

In a display device incorporating a touch sensor of Patent Document 1 (e.g., a display unit of a digital video camera disclosed in Patent Document 1), for example, even in the case in which static electricity generated during operation of the touch panel enters from a gap in the display unit, the static electricity is transmitted through a ground wiring line through an electric conductor exposing portion, thereby eliminating the static electricity appropriately. That is, in the display device incorporating the touch sensor of Patent Document 1, a malfunction caused by the static electricity is less likely to occur.

However, in the touch sensor of Patent Document 1, a front-side electric conductor exposing portion made of a copper foil layer which is very brittle in strength is formed so as to extend linearly from one end to the other end in a width direction of a signal wiring member (i.e., in a direction orthogonal to the direction in which a signal line extends). For this reason, if a bent signal wiring member is disposed in the display device, a so-called bending stress is likely to be caused locally at a bending position of the signal wiring member, and the bending stress is likely to concentrate particularly at the front-side electric conductor exposing portion. As a result, in the touch sensor of Patent Document 1, mechanical strength of the signal wiring member may decrease.

In view of the foregoing background, it is therefore an object of the present invention to keep an influence of the static electricity from occurring and to reduce a decrease in the mechanical strength of a wiring board.

Solution to the Problem

To achieve the above objective, a touch sensor of the first embodiment of the present invention includes a first sensor-board having a first sensor electrode and a first sensor terminal electrically connected to the first sensor electrode, and a wiring board having a first end mechanically connected to the first sensor board, a signal line portion electrically connected to the first sensor terminal at the first end, a ground portion electrically insulated from the signal line portion, and an insulating layer covering the ground portion. The insulating layer has a plurality of through holes passing through the insulating layer in a thickness direction of the wiring board and exposing the ground portion therethrough. The plurality of through holes are arranged at intervals. A line segment connects at least two of the plurality of through holes intersects the signal line portion.

Advantages of the Invention

The present invention allows an influence of static electricity to be kept from occurring and a decrease in the mechanical strength of a wiring board to be reduced.

DESCRIPTION OF EMBODIMENTS

Hereinafter, embodiments of the present invention will be described in detail with reference to the drawings. The following description of the embodiments is a mere example in nature, and is not at all intended to limit the scope, applications or use of the present invention.

First Embodiment

Figure 1:
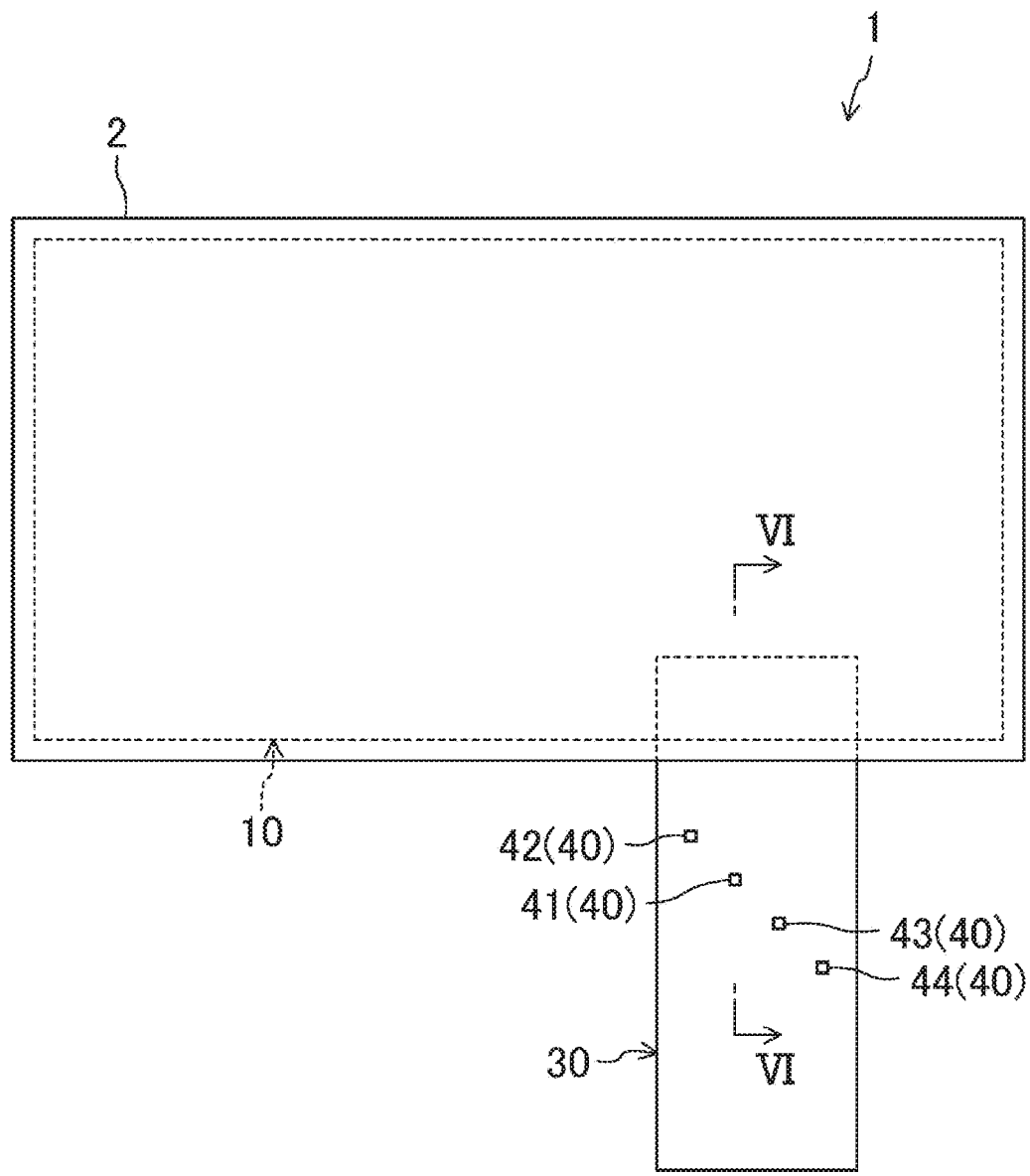
FIG. 1 is a plan view illustrating a touch sensor according to a first embodiment of the present invention.

FIG. 1 illustrates an entire touch sensor 1 of a first embodiment of the present invention. The touch sensor 1 is a sensing input device on which a touch operation may be performed. A display device 50 (see FIG. 7) incorporating the touch sensor 1 is used in, for example, a vehicle on-board unit such as a car navigation system, display equipment of a personal computer, a mobile phone, a personal digital assistant, a handheld game console, a copy machine, a ticket vending machine, and an automatic teller machine.

In the following description, a positional relationship between the touch sensor 1 and each of later-described components in the touch sensor 1 is specified based on an X direction, a Y direction, and a Z direction shown in the drawings. Specifically, the Y direction is defined as a direction parallel to a direction in which later-described signal line portions 32 extend. The X direction is defined as a direction orthogonal to the Y direction in an in-plane direction of a later-described first sensor surface 11. The Z direction is defined as a thickness direction of a later-described wiring board 30 orthogonal to the Y direction (see, e.g., FIG. 4). Note that such a positional relationship has nothing to do with an actual direction in the touch sensor 1 and the display device 50 incorporating the touch sensor 1.

Cover Member

As shown in FIG. 1, the touch sensor 1 includes a cover member 2 that is transparent to light. The cover member 2 is a cover lens made of, for example, cover glass or plastic. The cover member 2 is formed in, for example, a rectangular plate shape in a plan view and is configured such that its outline is larger than an outline of a later-described first sensor board 10.

Figure 6:
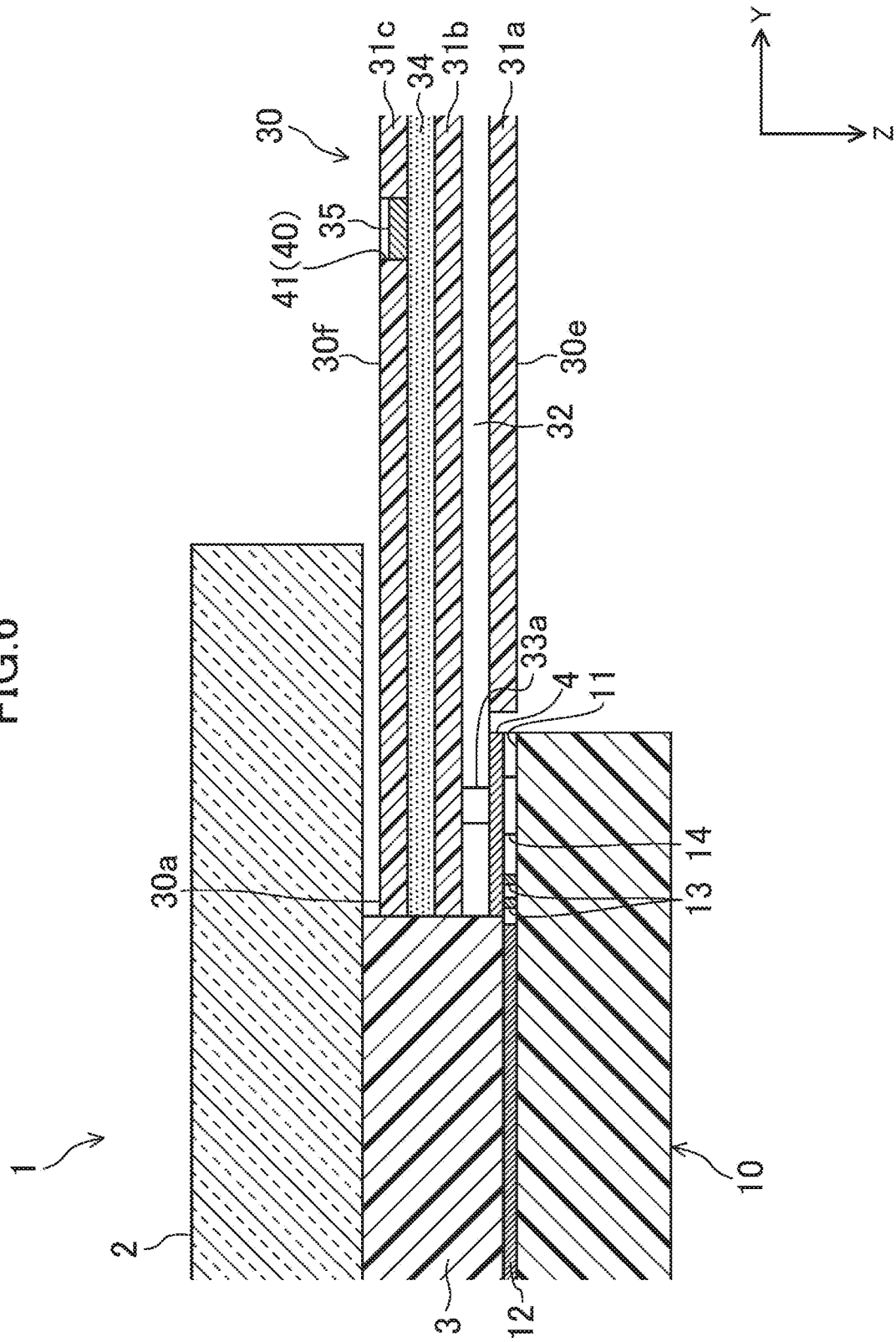
FIG. 6 is a cross-sectional view taken along line VI-VI of FIG. 2.

As shown in FIG. 6, the cover member 2 is stacked over the later-described first sensor board 10 via an adhesive layer 3. The cover member 2 is disposed such that its surface is located on a user visible side. As the adhesive layer 3, for example, an optical transparent adhesive sheet (optically clear adhesive (OCA)) is used.

First Sensor Board

Figure 2:
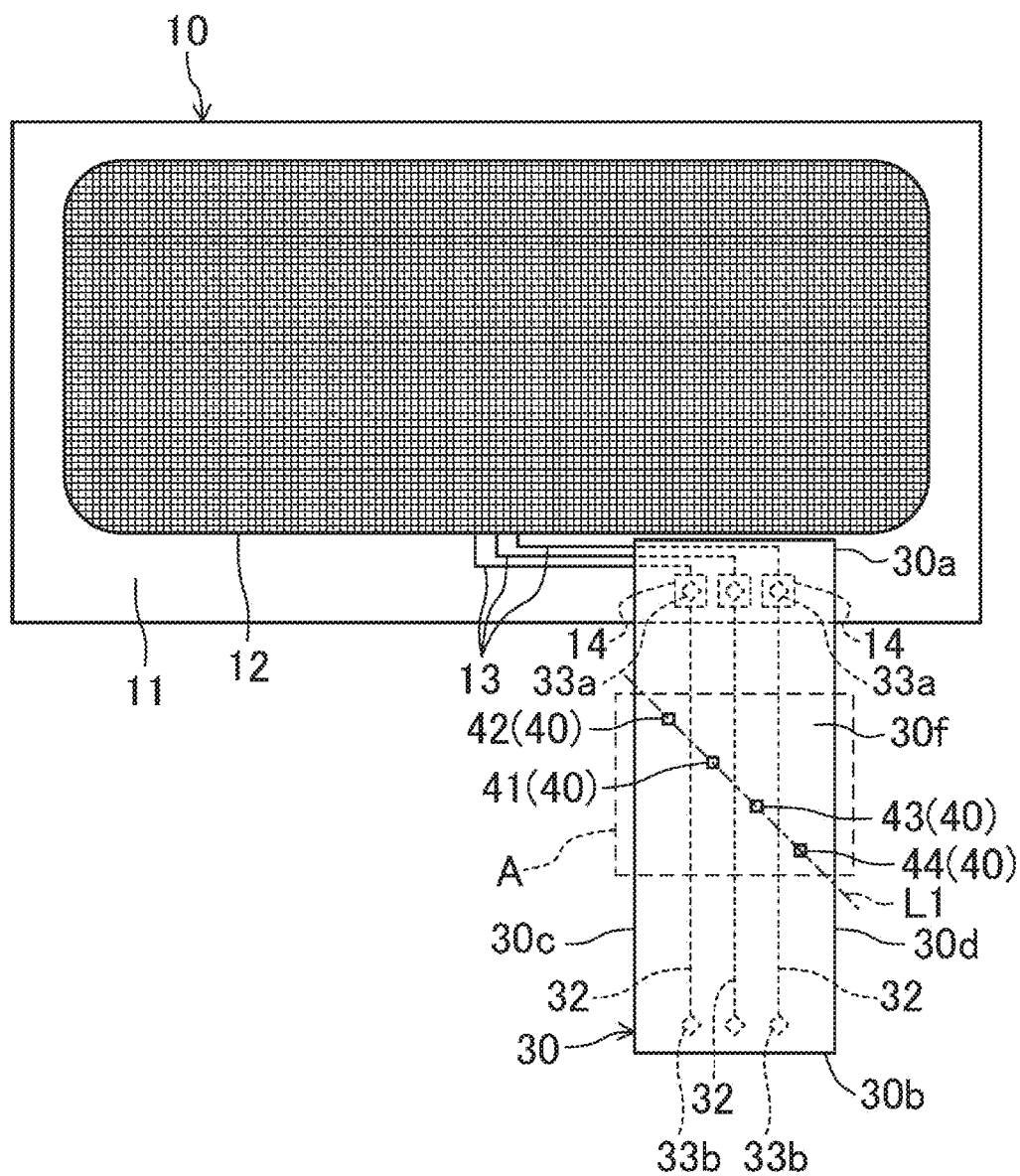
FIG. 2 is a plan view illustrating a first sensor board and a wiring board, which are connected to each other, of the present invention.

As shown in FIGS. 1 and 2, the touch sensor 1 includes a first sensor board 10. The first sensor board 10 is made of, for example, a material that is transparent to light. Specifically, the first sensor board 10 is suitably made of a resin material that is transparent to light, such as polycarbonate, polyethylene terephthalate, polyether sulfone, PMMA (acryl), and cycloolefin polymer (COP), or glass. The first sensor board 10 has, for example, a rectangular shape having a long side extending in the X direction.

As shown in FIGS. 2 and 6, the first sensor board 10 has a first sensor surface 11. In this embodiment, the first sensor board 10 is disposed such that the first sensor surface 11 faces a back surface of the cover glass.

On the first sensor surface 11, a first sensor electrode 12, routing lines 13, 13, . . . and first sensor terminals 14, 14, . . . are formed.

The first sensor electrode 12 is an electrostatic capacitance sensor body capable of sensing a touch operation performed by the user's finger (detection target) being in contact with the front surface of the cover member 2. The first sensor electrode 12 has, for example, a mesh structure in which a plurality of electroconductive thin wires are arranged in a mesh.

As a material of the first sensor electrode 12, an electroconductive metal such as silver, copper, aluminum, nickel, molybdenum, or an alloy of copper and nickel is desirably used, but an electroconductive resin material may be used, as well. Examples of a method for forming the first sensor electrode 12 include a sputtering vapor deposition, plating, photolithography, screen printing, and chemical-mechanical polishing (embedding).

As shown in FIG. 2, the first sensor terminals 14, 14, . . . are formed on a peripheral edge side of the first sensor surface 11. The first sensor terminals 14, 14, . . . are arranged at intervals along the X direction. Each of the first sensor terminals 14 is electrically connected to the first sensor electrode 12 via the corresponding routing line 13.

Wiring Board

As shown in FIGS. 1 and 2, the touch sensor 1 includes a wiring board 30. The wiring board 30 is a flexible printed circuit board whose electrical characteristics do not change even when deformed. The wiring board 30 is, for example, a flexible wiring board (flexible printed circuit (FPC)). The wiring board 30 is formed in a rectangular shape having long sides extending in the Y direction in a plan view. Note that the outline of the wiring board 30 is not limited to a rectangular shape, and the wiring board 30 may have any of various shapes.

The wiring board 30 has first and second ends 30a and 30b. The first end 30a is formed at a position overlapping the first sensor board 10, and is mechanically connected to the first sensor board 10. Specifically, the first end 30a is fixed to the first sensor surface 11 of the first sensor board 10 with an anisotropically electroconductive resin material 4 (see FIG. 6). On the other hand, the second end 30b is formed at a position apart from the first end 30a in the Y direction. The second end 30b is mechanically connected to a mounting board 54 of the later-described display device 50 (see FIG. 7).

The wiring board 30 has first and second outer edge portions 30c and 30d. Each of the first and second outer edge portions 30c and 30d extend linearly along the Y direction and are formed so as to face each other with an intervention of the later-described signal line portions 32, 32, . . . in the X direction.

Figure 4:
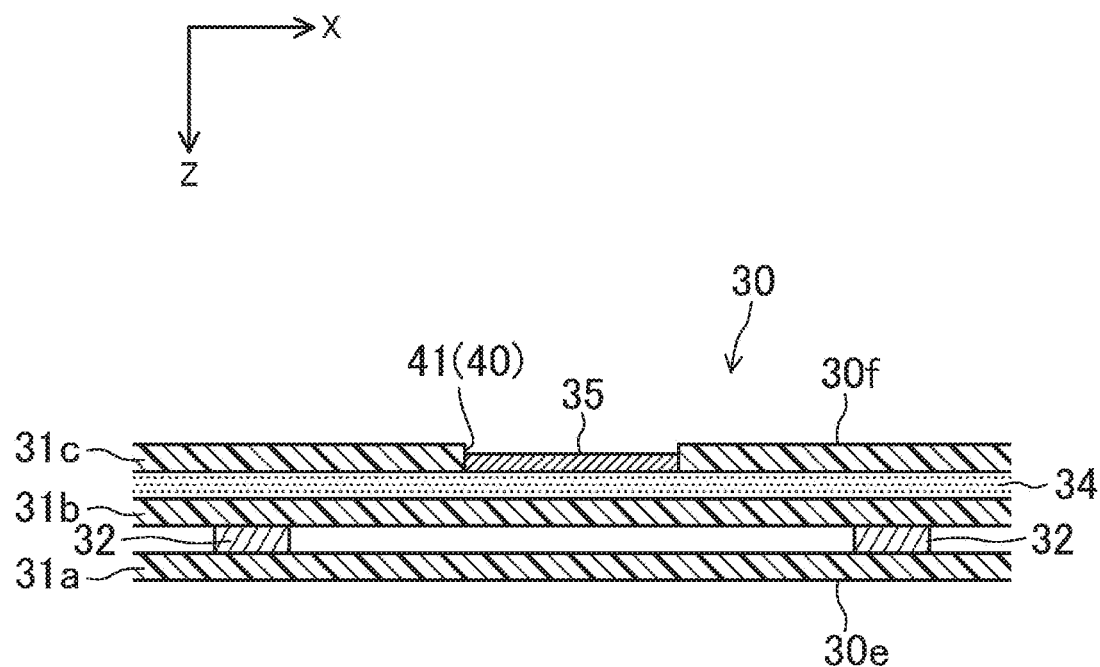
FIG. 4 is a cross-sectional view taken along line IV-IV of FIG. 3.
Figure 5:
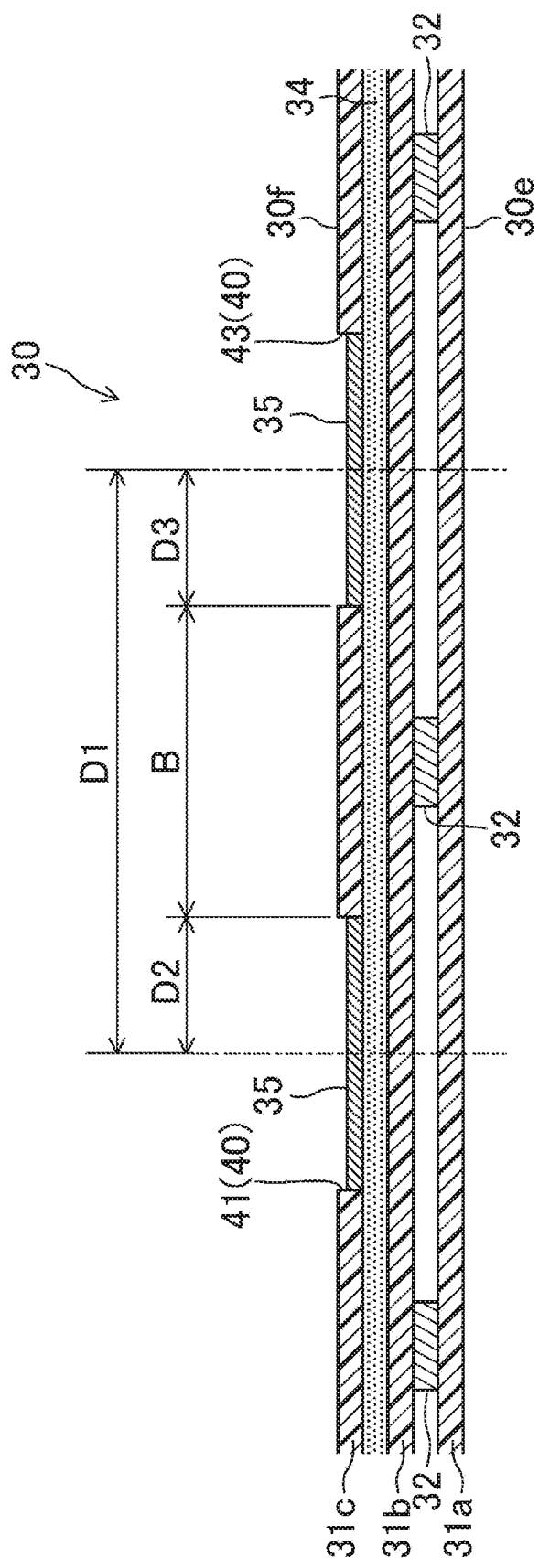
FIG. 5 is a cross-sectional view taken along line V-V of FIG. 3.

As shown in FIGS. 4 and 5, the wiring board 30 includes insulating layers 31a to 31c. Each of the insulating layers 31a to 31c is made of, for example, a resin material such as polyimide or polyester (PET). The insulating layers 31a to 31c adhere to each other with an epoxy resin-based adhesive or an acrylic resin-based adhesive, and then stacked in the Z direction.

As also shown in FIG. 6, the insulating layer 31a is disposed near the first sensor board 10 in a cross-sectional view. The insulating layer 31c is disposed near the cover member 2 in a cross-sectional view, and covers a front side of a later-described ground portion 34. The insulating layer 31b is disposed between the insulating layers 31a and 31c in a cross-sectional view, and covers a back side of the later-described ground portion 34.

As shown in FIG. 6, only the insulating layers 31b and 31c are located in a region Where the first sensor board 10 and the first end 30a overlap each other. In this region, a later-described first wiring terminal 33a located on a back side of the insulating layer 31b is disposed so as to face the first sensor surface 11. Similarly, only the insulating layers 31b and 31c are located in the region of the second end 30b.

The wiring board 30 has first and second wiring board surfaces 30e and 30f. The first wiring board surface 30e is located near the first sensor surface 11. Specifically, the first wiring hoard surface 30e corresponds to a back surface of the insulating layer 31a. On the other hand, the second wiring board surface 30f is located on the side opposite to the first wiring board surface 30e. Specifically, the second wiring board surface 30f corresponds to a surface of the insulating layer 31c facing the viewing side of the touch sensor 1.

Figure 3:
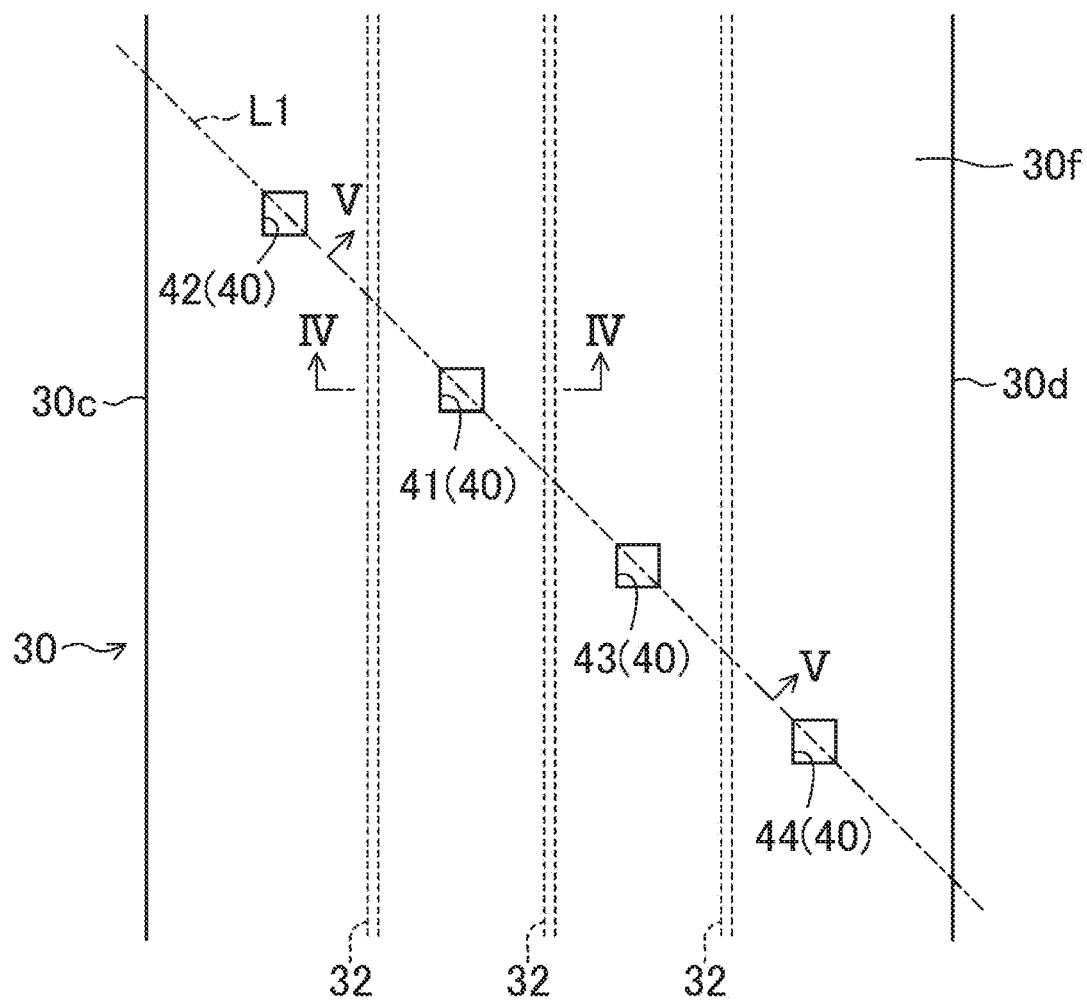
FIG. 3 is a partially enlarged plan view of a part A of FIG. 2.

As shown in FIGS. 2 and 3, the wiring board 30 includes the signal line portions 32, 32, . . . . Each of the signal line portions 32 is made of an electroconductive material such as copper. Each of the signal line portions 32 extends linearly in the Y direction. The signal line portions 32, 32, . . . are disposed at intervals in the X direction. As shown in FIGS. 4 to 6, each of the signal line portions 32 is stacked between the insulating layers 31a and 31b in a cross-sectional view.

As shown in FIG. 2, first and second wiring terminals 33a and 33b are formed at the respective both ends of each of the signal line portions 32. The first wiring terminals 33a are formed at one ends of the signal line portions 32 located near the first end 30a. The first wiring terminals 33a are stacked on a back surface of the insulating layer 31b in a region of the first end 30a (see FIG. 6). On the other hand, the second wiring terminals 33b are formed at the other ends of the signal line portions 32 located near the second end 30b. The second wiring terminals 33b are stacked on the back surface of the insulating layer 31b at the second end 30b (not shown). Each of the first and second wiring terminals 33a and 33b are electrically connected to each other via the signal line portions 32.

As shown in FIGS. 4 to 6, the wiring board 30 has the ground portion 34. The ground portion 34 is made of an electroconductive material such as copper. The ground portion 34 is stacked planarly between the insulating layers 31b and 31c. The ground portion 34 is connected to ground potential, and is electrically insulated from the signal line portions 32. The ground portion 34 is configured such that a part thereof is exposed through later-described through holes 40, 40, . . . provided near the second wiring board surface 30f.

As shown in FIGS. 1 to 6, the wiring board 30 is provided with a plurality of through holes 40, 40, . . . for allowing part of the ground portion 34 to expose therethrough. Each of the through holes 40 is formed so as to pass through part of the insulating layer 31c in the Z direction (see FIG. 4 to FIG. 6). Note that, in this embodiment, the through holes 40, 40, . . . are disposed at positions other than the position at which the cover member 2 and the wiring board 30 overlap each other.

As shown in FIGS. 1 to 3, the through holes 40, 40, . . . include first to fourth through holes 41 to 44. The first to fourth through holes 41 to 44 are arranged in a row along a virtual line segment L1 connecting the second through hole 42 and the third through hole 43. In this embodiment, the line segment L1 obliquely intersects the Y direction from upper left to lower right in FIG. 3. Further, the line segment L1 overlaps a diagonal line across each of the first to fourth through holes 41 to 44. Specifically, the first to fourth through holes 41 to 44 are arranged such that the line segment L1 connecting at least two through holes 40, 40, . . . intersects the signal line portions 32. Further, the first to fourth through holes 41 to 44 are arranged at intervals in the direction along the line segment L1.

The first through hole 41 is disposed at a second position from a position (the left side in FIG. 3) of the first outer edge portion 30c and is located on the line segment L1.

The second through hole 42 is disposed at a first position from the position of the first outer edge portion 30c. Specifically, the second through hole 42 is disposed to be located adjacent to the first through hole 41 and located closer to the first outer edge portion 30c than the first through hole 41.

The third through hole 43 is disposed at a third position from the position of the first outer edge portion 30c. Specifically, the third through hole 43 is disposed to be located adjacent to the first through hole 41 and located closer to the second outer edge portion 30d than the first through hole 41.

The fourth through hole 44 is disposed at a fourth position from the position of the first outer edge portion 30c. Specifically, the fourth through hole 44 is disposed to be located adjacent to the third through hole 43 and located closer to the second outer edge portion 30d than the third through hole 43.

As shown in FIGS. 3 and 5, the through holes 41 (40) and 43 (40) adjacent to each other are formed such that an interval B (see FIG. 5) between them is larger than a length of the diagonal line of each through hole 40 in the direction along the line segment L1. Each of the through holes 40 is formed such that an outer diameter thereof is much smaller than the outline of the wiring board 30 in a plan view. In this embodiment, each of the through holes 40 is formed in a square shape.

Here, the interval B corresponds to, for example, a distance D4 obtained by subtracting a total value of distances D2 and D3 from a distance D1. The distance D1 is a distance from a center of the first through hole 41 to a center of the third through hole 43. The distance D2 is a distance from the center of the first through hole 41 to a corner on the diagonal line of the first through hole 41. The distance D3 is a distance from the center of the third through hole 43 to a corner on the diagonal line of the third through hole 43.

As shown in FIGS. 4 to 6, the wiring board 30 has an electroconductive layer 35. The electroconductive layer 35 is made of an electroconductive material including gold (Au). The electroconductive layer 35 is stacked in each of the through holes 40 on an upper side of the ground portion 34. The electroconductive layer 35 is electrically connected to the ground portion 34.

Note that the electroconductive layer 35 is preferably made of an electroconductive material that is hardly oxidized. This is because a later-described advantage of eliminating static electricity deteriorates when the electroconductive layer 35 is oxidized. Specifically, the electroconductive material of the electroconductive layer 35 is not limited to gold (Au), and may include, for example, silver (Ag), copper (Cu), iron (Fe), nickel (Ni), and tin (Sn). Alternatively, the electroconductive layer 35 may be made of a polymer compound or a carbon sheet having electrical conductivity.

Display Device

Next, a display device 50 including the touch sensor 1 will be described with reference to FIG. 7.

Figure 7:
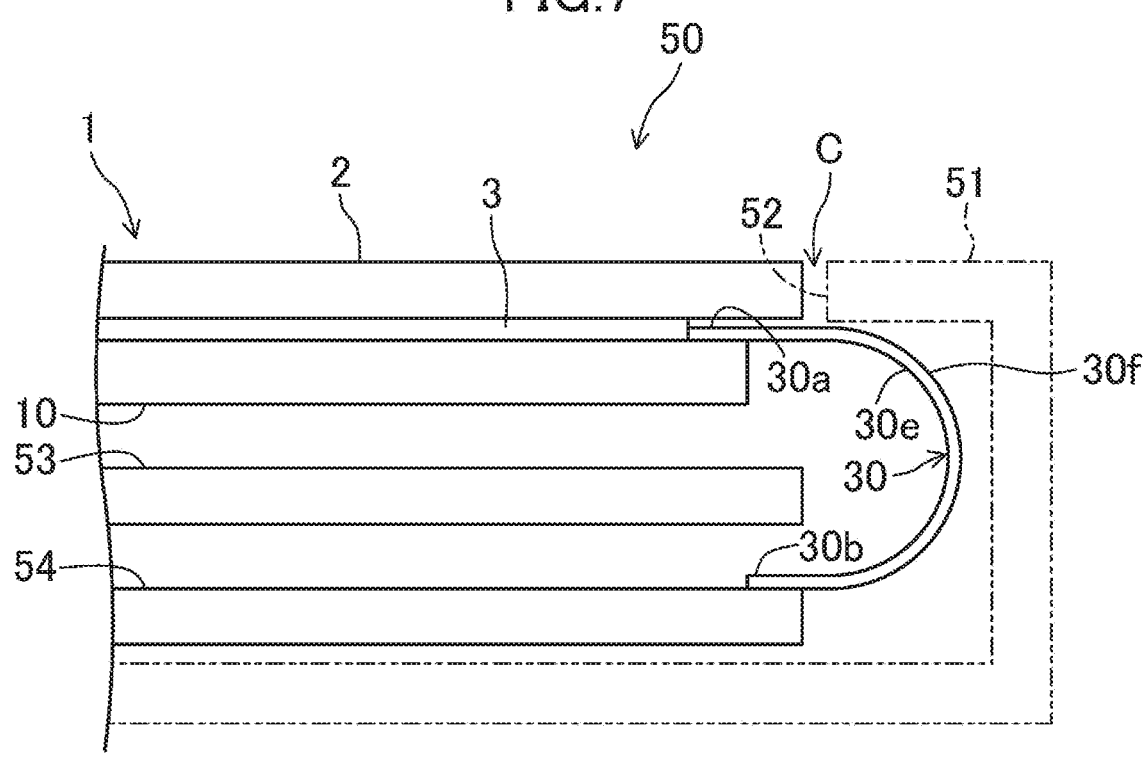
FIG. 7 is a schematic view schematically illustrating a configuration of a display device including the touch sensor.

The display device 50 includes a device body 51 (see the virtual line in FIG. 7). The device body 51 is formed in a box shape, and constitutes a casing of the display device 50. An opening 52 is formed on an upper side of the device body 51. The touch sensor 1, a display 53, and the mounting board 54 are provided inside the device body 51.

The display 53 is, for example, a liquid crystal display (LCD) 53. Further, the mounting board 54 is provided with, for example, a circuit unit and a control unit (both not shown) that control operation of the display device 50.

The touch sensor 1 is disposed at a position corresponding to the opening 52 of the device body 51. Further, the display 53 is disposed below the touch sensor 1 inside the device body 51. Specifically, the display 53 is disposed at a position facing a back surface of the first sensor board 10 of the touch sensor 1.

The mounting board 54 is disposed toward the display 53 relative to the touch sensor 1. Specifically, the mounting board 54 is disposed near the bottom of the device body 51 at a position facing a back surface of the display 53.

The wiring board 30 is being bent to be curved inside the device body 51, and is mechanically connected to the mounting board 54. The first end 30a of the wiring board 30 is fixed to the first sensor surface 11 of the first sensor board 10, while the second end 30b of the wiring board 30 is fixed to a terminal (not shown) of the mounting board 54. Accordingly, the touch sensor 1 and the mounting board 54 are electrically connected to each other via the wiring board 30. Further, the first wiring board surface 30e of the wiring board 30 is located so as to face a space in which the touch sensor 1 and the mounting board 54 face each other.

As described above, the wiring board 30 is configured such that part of the ground portion 34 is exposed through the through holes 40, 40, . . . formed in the second wiring board surface 30f. On the other hand, as shown in FIG. 7, the second wiring board surface 30f of the wiring board 30 is disposed at a position facing a gap C formed between the cover member 2 of the touch sensor 1 and the opening 52 of the device body 51 in the device main body 51. The wiring board 30 is disposed in the device body 51 such that the through holes 40, 40, . . . are located in a vicinity of the gap C.

Advantages of First Embodiment

As described above, the wiring board 30 of the touch sensor 1 is provided with through holes 40, 40, . . . for allowing part of the ground portion 34 to expose through the insulating layer 31 to an outside. Accordingly, for example, static electricity generated during the operation of the touch sensor 1 easily flows into the ground portion 34 exposed through each through hole 40. That is, static electricity is eliminated by the ground portion 34 and hardly flows toward the display device 50 (specifically, the mounting board 54 of the display device 50). This allows avoidance of a malfunction caused by static electricity in the display device 50.

On the other hand, if the touch sensor 1 is disposed in the device body 51 of the display device 50 shown in, for example, FIG. 7, with the wiring board 30 being bent, a so-called bending stress is likely to be caused locally at the bending position of the wiring board 30. To address this problem, in the touch sensor 1, the through holes 40, 40, . . . are disposed at intervals and a line segment L1 connecting at least two of the through holes 40, 40, . . . intersects the signal line portions 32. That is, the through holes 40, 40, . . . for allowing part of the ground portion 34 to expose through the insulating layer 31c are dispersed in the direction in which the signal line portions 32 extends. Accordingly, even when the wiring board 30 is bent, the bending stress is less likely to concentrate at the ground portion 34 exposed through each of the through holes 40. This allows a decrease in the mechanical strength of the wiring hoard 30 to be reduced.

Therefore, the touch sensor 1 according to the first embodiment of the present invention allows the influence of static electricity to be kept from occurring and the decrease in the mechanical strength in a wiring board 30 to be reduced.

Further, the first through hole 41 is located on the line segment L1 connecting the second through hole 42 and the third through hole 43. That is, at least three through holes 40, 40, . . . are located on the line segment L1. This makes it possible to appropriately eliminate static electricity in accordance with the arrangement of the touch sensor 1 in the display device 50.

Further, the wiring board 30 has the electroconductive layer 35 that is stacked in each of the through holes 40 and electrically connected to the ground portion 34. The ground portion 34 exposed through each of the through holes 40 may be appropriately protected by the electroconductive layer 35. Further, copper contained in the ground portion 34 may improve the electrical conductivity of the ground portion 34, while gold contained in the electroconductive layer 35 may appropriately reduce oxidation of the ground portion 34.

Further, the interval B (see FIG. 5) between the through holes 40, 40, . . . is larger than the length of the diagonal line of each of the through holes 40, in the direction along the line segment L1. In this way, the outer diameter of each of the through holes 40 may be very small relative to the outline of the wiring board 30. This allows stress to be less likely to concentrate at the ground portion 34 that is exposed through each through hole 40 even with the wiring board 30 being bent. Therefore, it is possible to further reduce the decrease in the mechanical strength of the wiring board 30.

Further, the ground portion 34 is exposed on the second wiring board surface 30f. Specifically, when the touch sensor 1 is disposed, for example, in the device body 51 of the display device 50 (see FIG. 7), the ground portion 34 is exposed through each of the through holes 40 near the second wiring board surface 30f of the wiring board 30 facing an operation side (viewing side of the touch sensor 1) of the display device 50. Accordingly, static electricity venerated during the operation of the touch sensor 1 easily flows into the ground portion 34 through each of the through holes 40. Therefore, the influence of static electricity on the display device 50 incorporating the touch sensor 1 may be more reliably kept from occurring.

First Variation of First Embodiment

Figure 8:
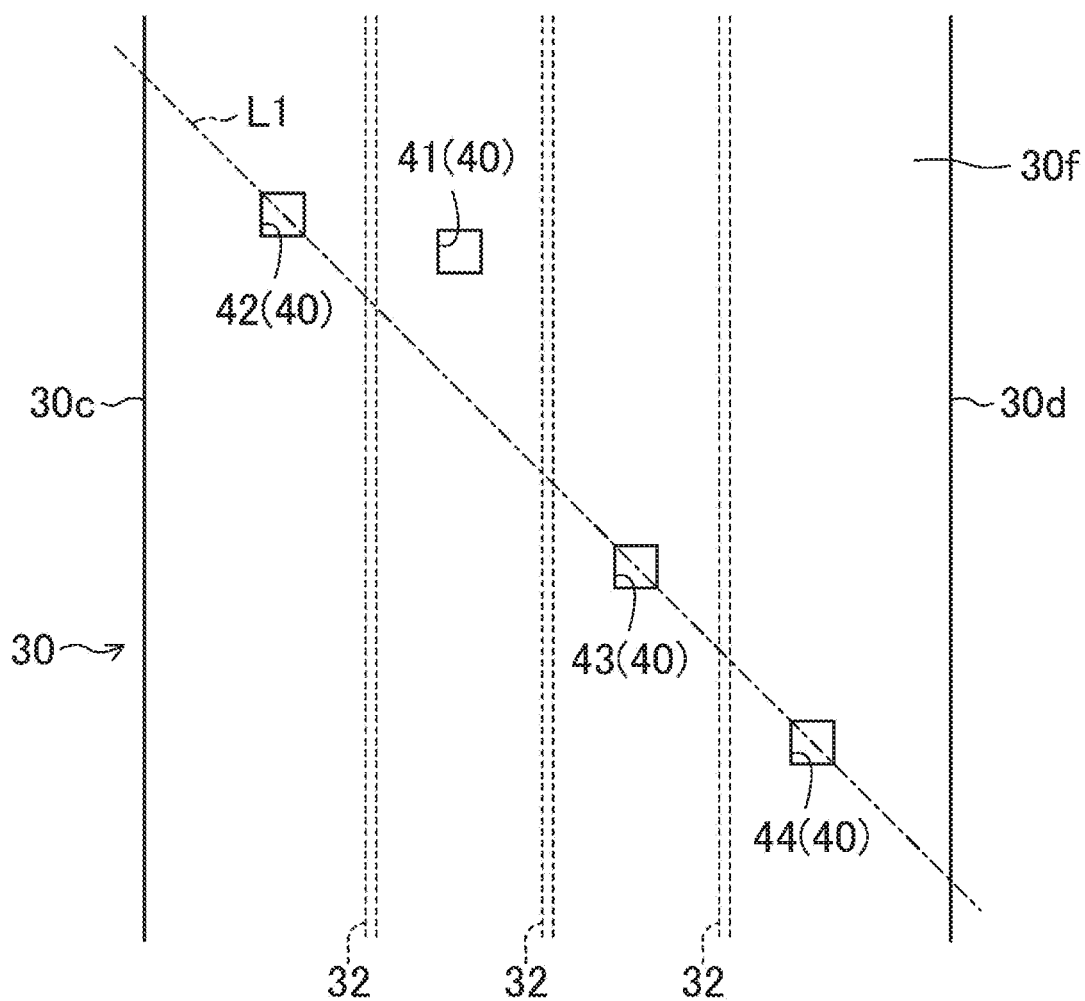
FIG. 8 is a view corresponding to FIG. 3, illustrating a wiring board according to a first variation of the first embodiment.

In the first embodiment, the first through hole 41 is located on the line segment L1. However, the first through hole 41 is not limited to this configuration. For example, as in the first variation illustrated in FIG. 8, the first through hole 41 may be disposed closer to the first end 30a than the line segment L1. In this way, static electricity hardly flows toward the first sensor electrode 12.

Second Variation of First Embodiment

Figure 9:
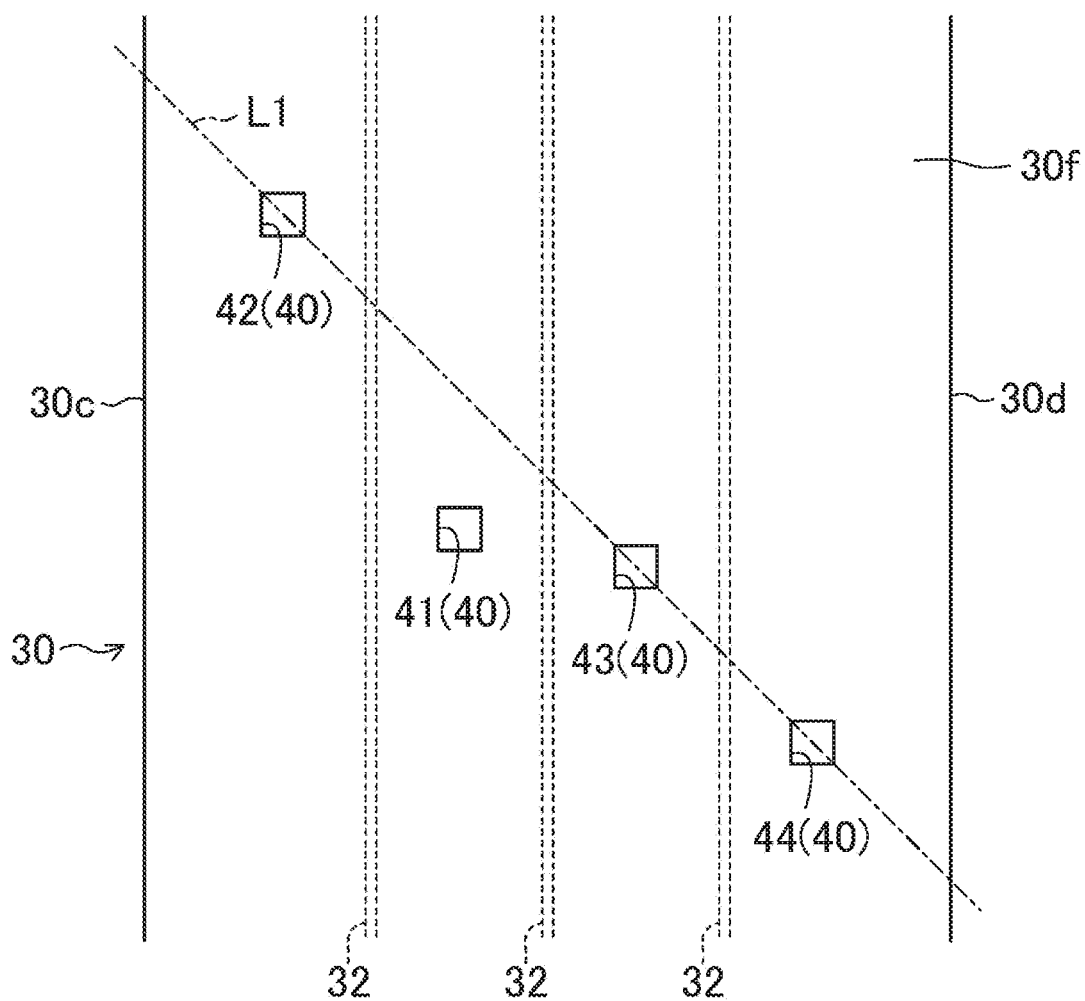
FIG. 9 is a view corresponding to FIG. 3, illustrating a wiring board according to a second variation of the first embodiment.

The first through hole 41 may be disposed closer to the second end 30b than the line segment L, as in the second variation shown in FIG. 9. In this way, static electricity hardly flows toward the mounting board 54 of the display device 50 shown in FIG. 7, for example.

Third Variation of First Embodiment

Figure 10:
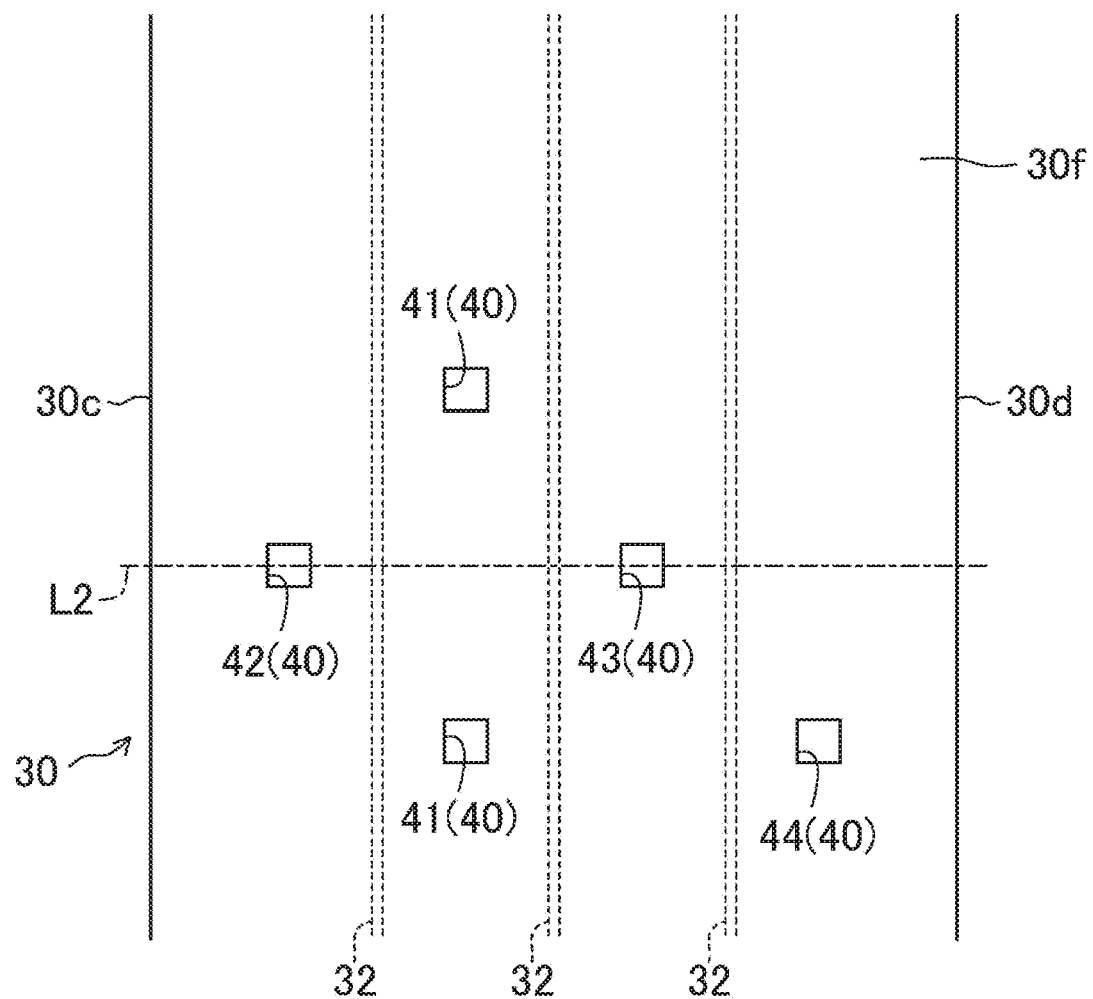
FIG. 10 is a view corresponding to FIG. 3, illustrating a wiring board according to a third variation of the first embodiment.

In the first embodiment, the line segment L1 obliquely intersects the Y direction. However, the segment line L1 is not limited to this configuration. For example, instead of the line segment L1, a line segment L2 may be configured to intersect the signal line portions 32 and to extend in the X direction (i.e., in the direction from the first outer edge portion 30c toward the second outer edge portion 30d), as in the third variation shown in FIG. 10.

Further, in the first and second variations, one first through hole 41 is disposed closer to one of the first end 30a or the second end 30b than the line segment L1. However, the first through hole 41 is not limited to this configuration. Specifically, a plurality (two in the illustrated example) of the first through holes 41, 41 may be provided between the second through hole 42 and the third through hole 43, and the respective first through holes 41 may be disposed closer to the first end 30a and the second end 30b than the line segment L2, as in the third variation. In this way, static electricity hardly flows toward both the first sensor electrode 12 and the mounting board 54 of the display device 50.

Second Embodiment

Figure 11:
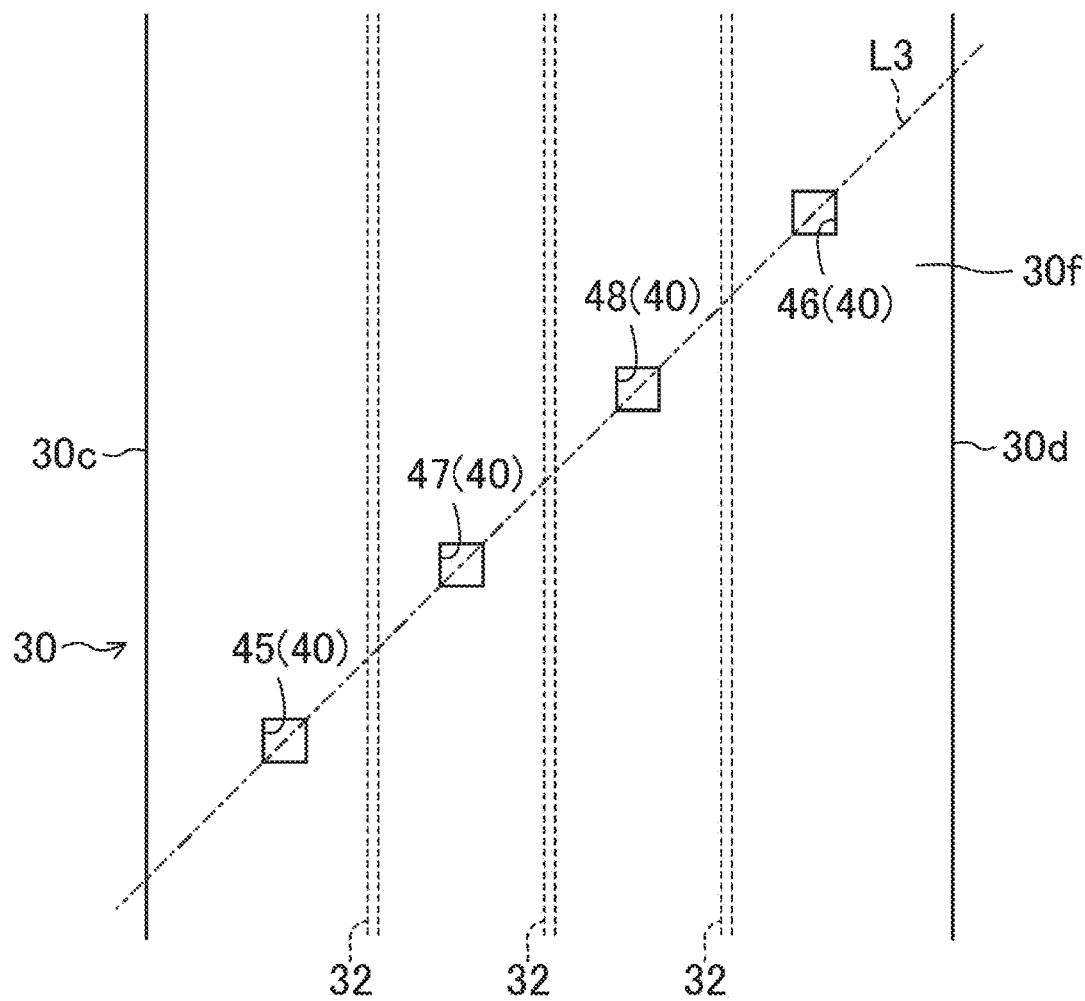
FIG. 11 is a view corresponding to FIG. 3, illustrating a wiring board according to a second embodiment of the present invention.

FIG. 11 illustrates a touch sensor 1 according to a second embodiment of the present invention. In this embodiment, fifth to eighth through holes 45 to 48 are provided instead of the first to fourth through holes 41 to 44 described in the first embodiment. The other configuration of the touch sensor 1 according to the present embodiment is the same as that of the touch sensor 1 according to the first embodiment. For this reason, in the following description, the same parts as those shown in FIGS. 1 to 10 are denoted by the same reference numerals, and detailed description thereof will be omitted.

As shown in FIG. 11, in this embodiment, the through holes 40, 40, . . . consist of the fifth to eighth through holes 45 to 48. The wiring board 30 is configured such that the fifth through hole 45 is located near the first outer edge portion 30c and the sixth through hole 46 is located near the second outer edge portion 30d.

The fifth to eighth through holes are disposed at intervals along a line segment L3 connecting the fifth through hole 45 and the sixth through hole 46, and are arranged in a row along the line segment L3. That is, the seventh and eighth through holes 47, 48 are located on the line segment L3. Here, the line segment L3 obliquely intersects the Y direction from the upper right to the lower left in FIG. 11, and overlaps the diagonal line of each of the through holes 40.

As in the first embodiment, also in this embodiment, the influence of static electricity on the display device 50 incorporating the touch sensor 1 may be kept from occurring, and a decrease in the mechanical strength in a wiring board 30 may be reduced. Further, the four through holes 40, 40, . . . arranged on the line segment L3 allows static electricity to be appropriately eliminated in accordance with the arrangement of the touch sensor 1 in the display device 50.

First Variation of Second Embodiment

Figure 12:
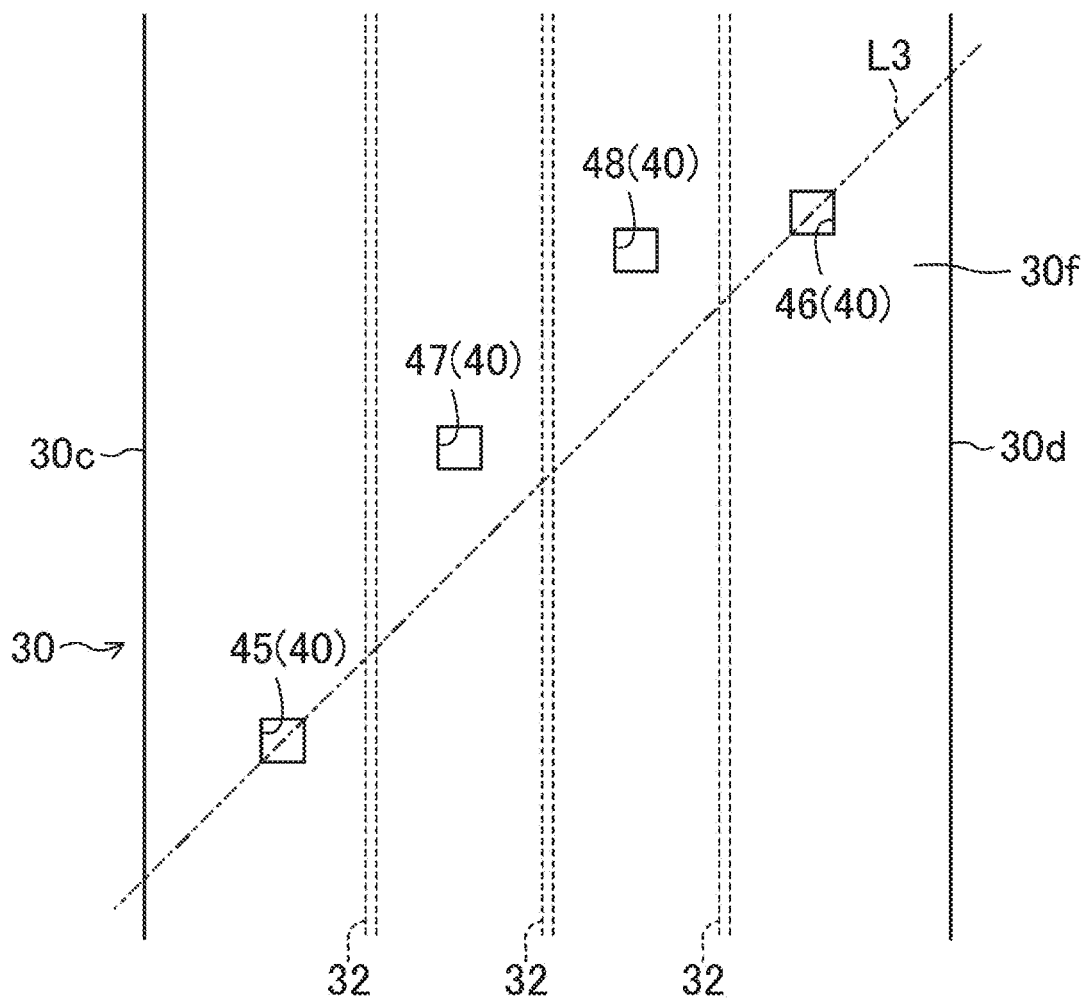
FIG. 12 is a view corresponding to FIG. 11, illustrating a wiring board according to a first variation of the second embodiment.

In the second embodiment, the seventh and eighth through holes 47, 48 are located on the line segment L3. However, the seventh and eighth through holes 47, 48 are not limited to this configuration. For example, the seventh and eighth through holes 47, 48 may be disposed closer to the first end 30a than the line segment L3, as in the first variation illustrated in FIG. 12. In this way, static electricity hardly flows toward the first sensor electrode 12.

Second Variation of Second Embodiment

Figure 13:
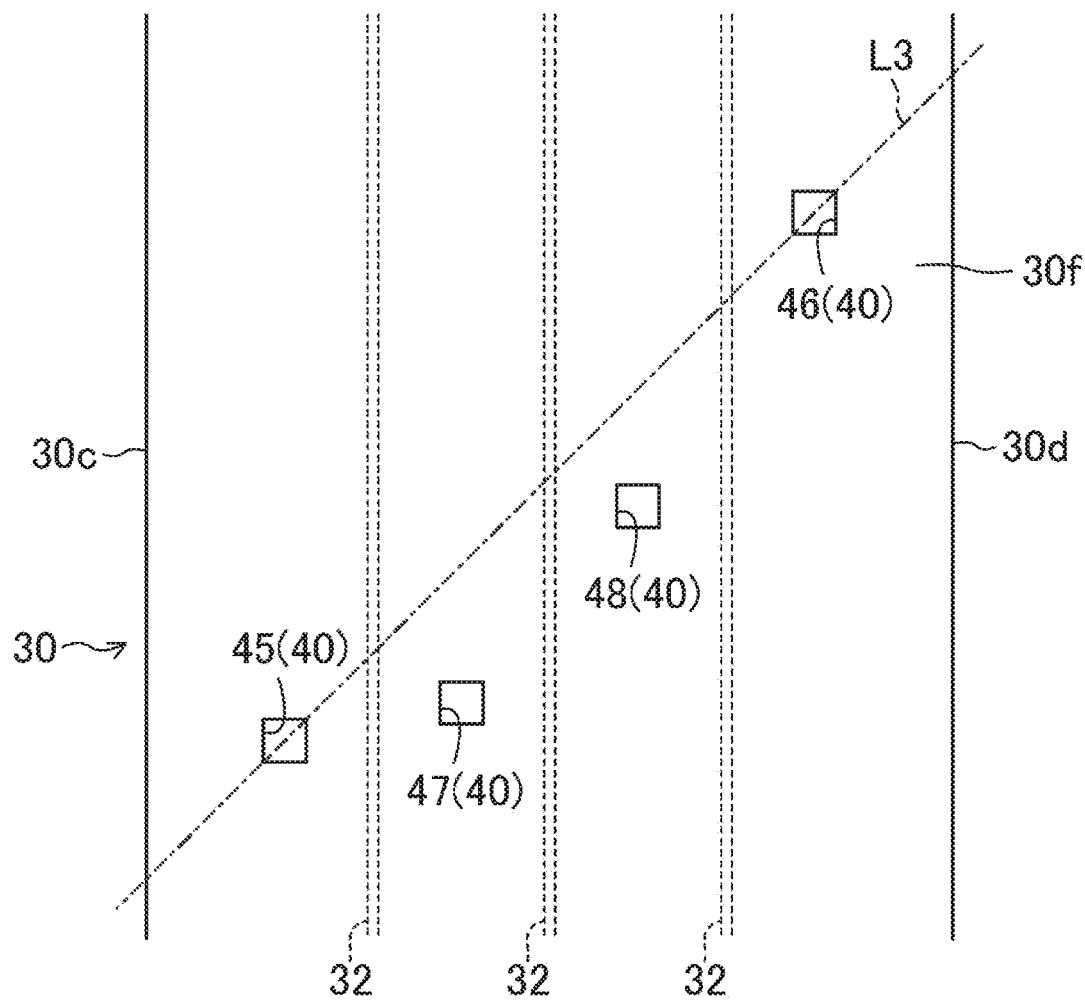
FIG. 13 is a view corresponding to FIG. 11, illustrating a wiring board according to a second variation of the second embodiment.

The seventh and eighth through holes 47, 48 may be disposed closer to the second end 30b than the line segment L3, as in the second variation shown in FIG. 13. In this way, static electricity hardly flows toward the mounting board 54 of the display device 50 shown in FIG. 7, for example.

Another Example of First Variation of Each Embodiment

Figure 14:
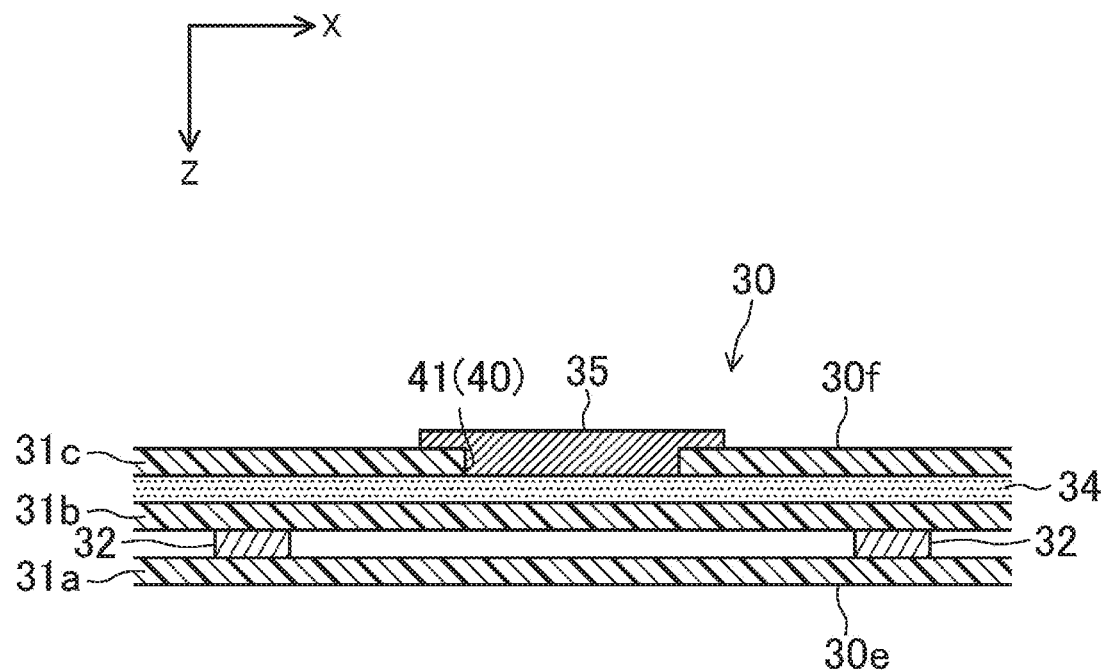
FIG. 14 is a view corresponding to FIG. 4, illustrating a cross-sectional configuration of a wiring board according to another example of the first variation of the first and second embodiments.

In each of the embodiments, the electroconductive layer 35 is stacked on the upper side of the ground portion 34 in each of the through holes 40. However, the electroconductive layer 35 is not limited to this configuration. For example, as shown in FIG. 14, the electroconductive layer 35 may be configured to be stacked on the upper side of the ground portion 34 in each of the through holes 40, while part of the electroconductive layer 35 covers the insulating layer 31 located around the through hole 40. This configuration improves the strength of the insulating layer 31 located around each of the through holes 40, thereby reinforcing the wiring board 30.

Another Example of Second Variation of Each Embodiment

Figure 15:
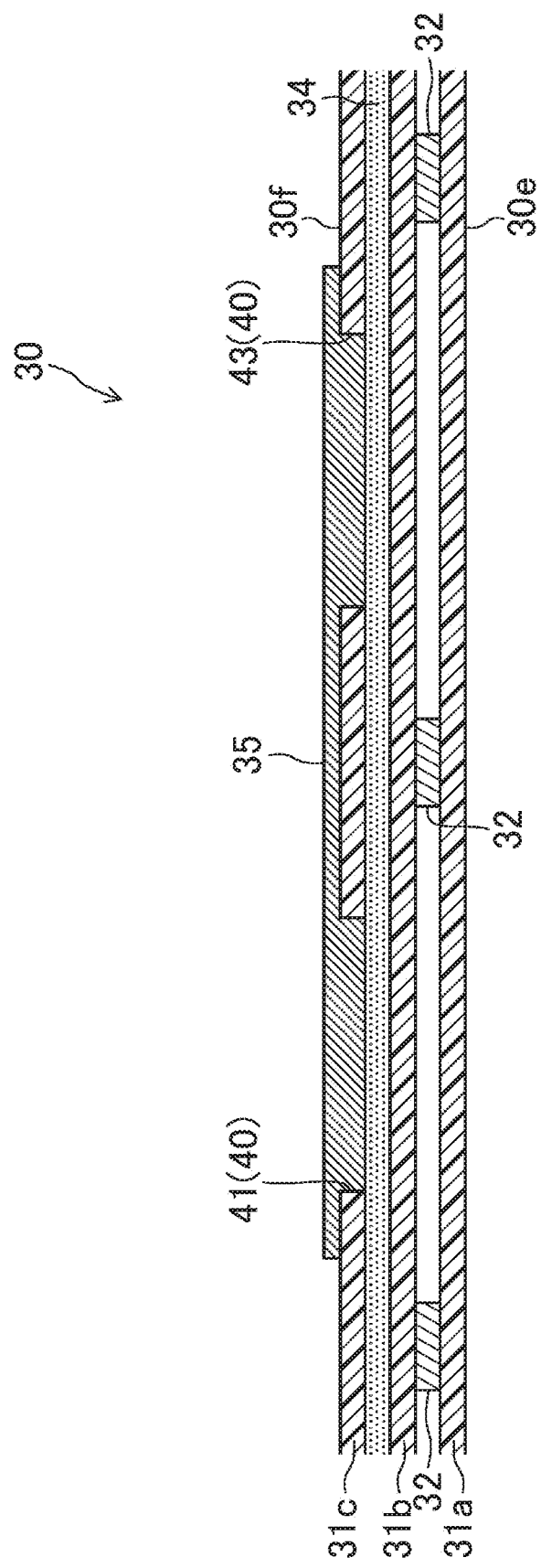
FIG. 15 is a view corresponding to FIG. 5, illustrating a cross-sectional configuration of a wiring board according to another example of the second variation of the first and second embodiments.

Further, as shown in FIG. 15, the electroconductive layer 35 may be configured to cover part of the insulating layer 31 with the electroconductive layer 35 being across the adjacent through holes 40, 40. This configuration further increases the strength of the insulating layer 31.

Another Example of Third and Fourth Variations of Each Embodiment

Figure 16:
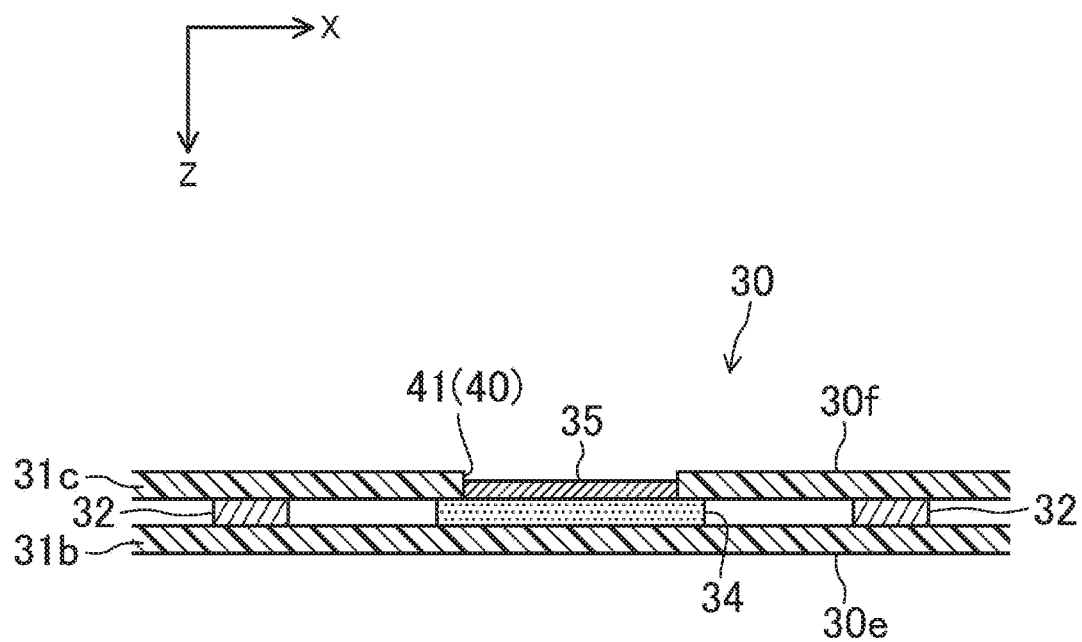
FIG. 16 is a view corresponding to FIG. 4, illustrating a cross-sectional configuration of a wiring board according to another example of the third variation of the first and second embodiments.
Figure 17:
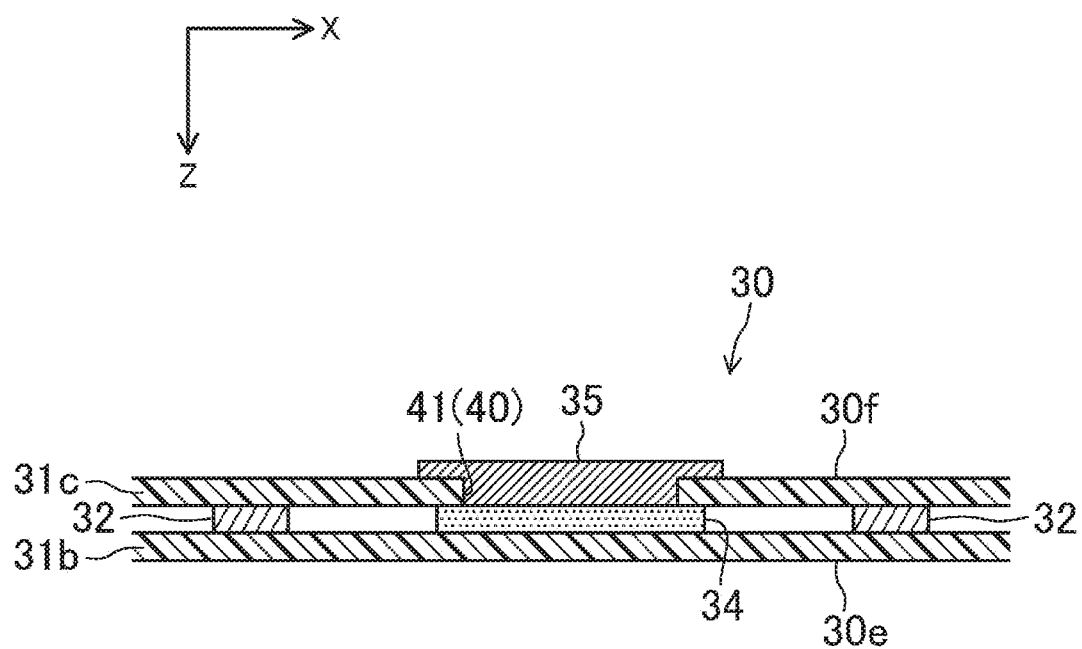
FIG. 17 is a view corresponding to FIG. 4, illustrating a cross-sectional configuration of a wiring board according to another example of the fourth variation of the first and second embodiments.

In each of the embodiments, the wiring board 30 includes insulating layers 31a to 31c. The signal line portions 32 are stacked between the insulating layers 31a and 31b, while the ground portion 34 is stacked between the insulating layers 31b and 31c. However, the wiring board 30 is not limited to this configuration. Specifically, as illustrated in FIGS. 16 and 17, the wiring board 30 may include the insulating layers 31b and 31c, and the signal line portions 32 and the ground portion 34 may be stacked between the insulating layers 31b and 31c. Note that the signal line portions 32 and the ground portion 34 are disposed at intervals and electrically insulated from each other.

Another Example of Fifth Variation of Each Embodiment

Figure 18:
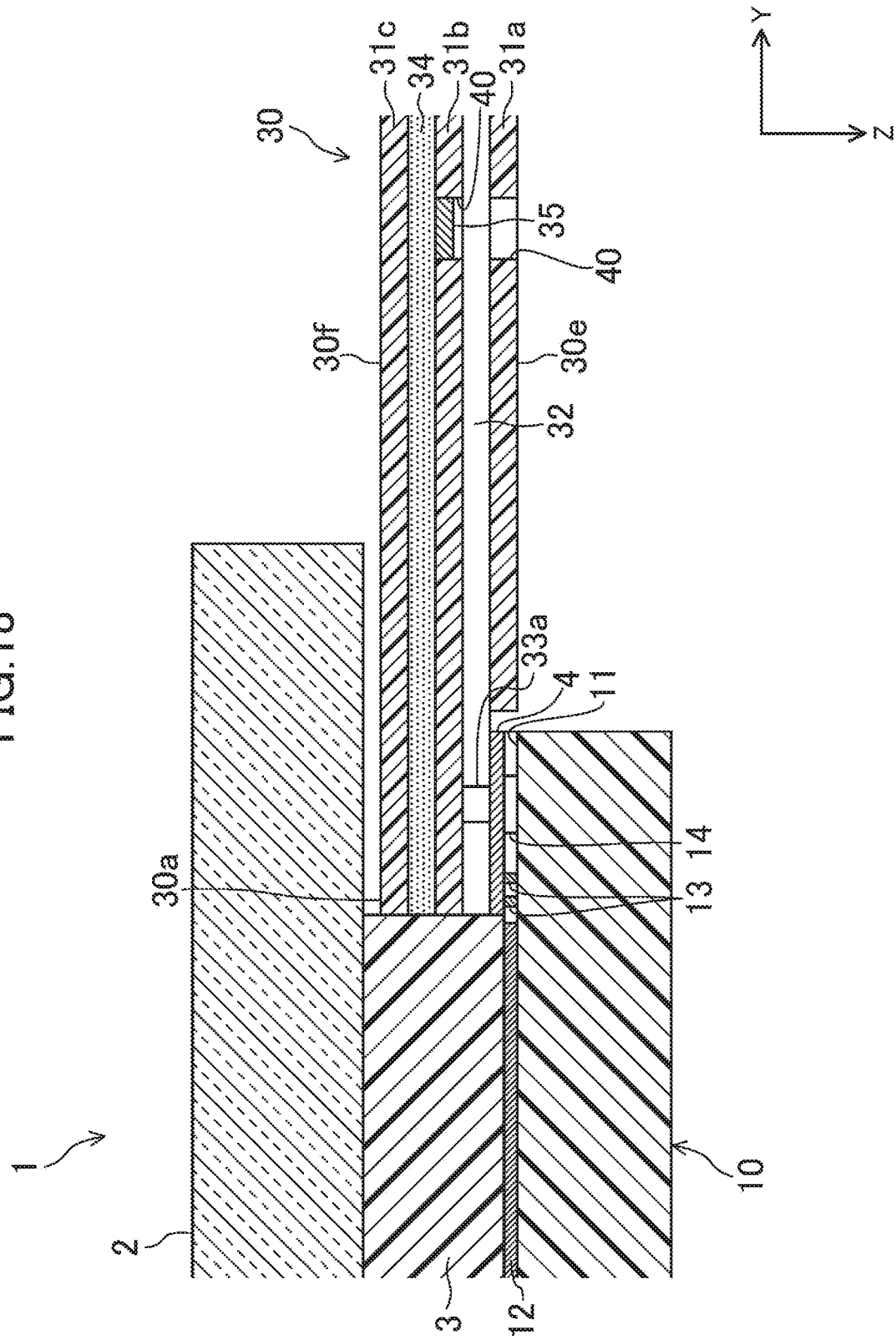
FIG. 18 is a view corresponding to FIG. 6, illustrating a cross-sectional configuration of a wiring board according to another example of the fifth variation of the first and second embodiments.

In each of the embodiments, the through holes 40 are formed in the insulating layer 31c which is near the second wiring board surface 30f, and part of the ground portion 34 is exposed on the second wiring board surface 30f. However, the through holes 40 are not limited to this configuration. Specifically, as shown in FIG. 18, the through holes 40 may be formed in the insulating layers 31b and 31c, and part of the ground portion 34 may be exposed on the first wiring board surface 30e. This allows static electricity to be kept from flowing from a side opposite to the viewing side of the touch sensor 1. Note that the electroconductive layer 35 only needs to be formed in through holes 40 formed in the insulating layer 31b.

Another Example of Sixth Variation of Each Embodiment

Figure 19:
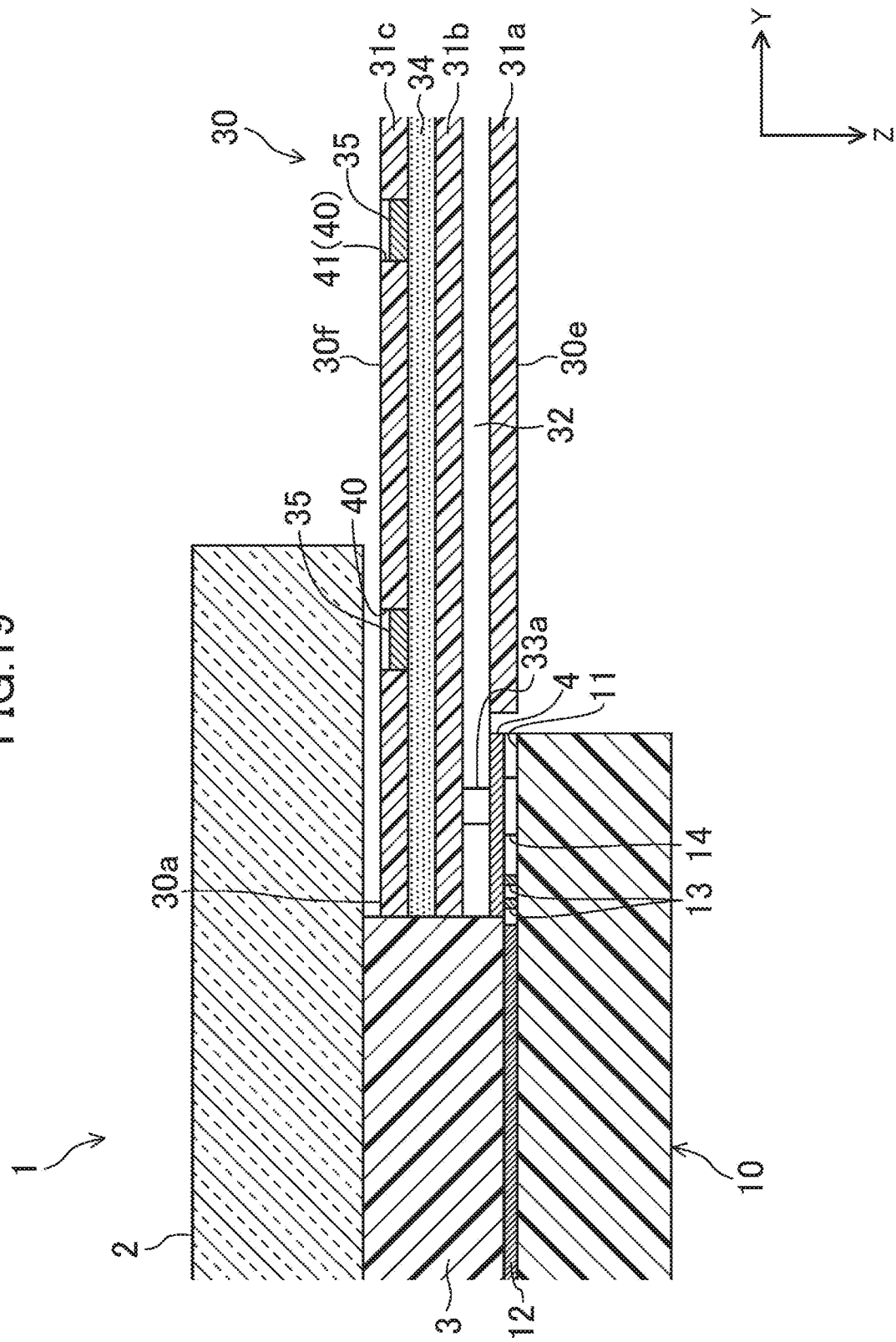
FIG. 19 is a view corresponding to FIG. 6, illustrating a cross-sectional configuration of a wiring board according to another example of the sixth variation of the first and second embodiments.

In each of the embodiments, the through holes 40, 40, ... are disposed in the wiring board 30 at positions where the cover member 2 and the wiring board 30 do not overlap each other in the Z direction. However, the through holes 40, 40, ... are not limited to such a configuration. For example, as shown in FIG. 19, at least one through hole 40 may be disposed at a position where the cover member 2 and the wiring board 30 overlap each other. Specifically, the through hole 40 may be located between the outline of the cover member 2 and the outline of the first sensor board 10. In this variation, static electricity may be reliably kept from flowing toward the first sensor electrode 12.

Additional Example of Seventh Variation of Each Embodiment

Figure 20:
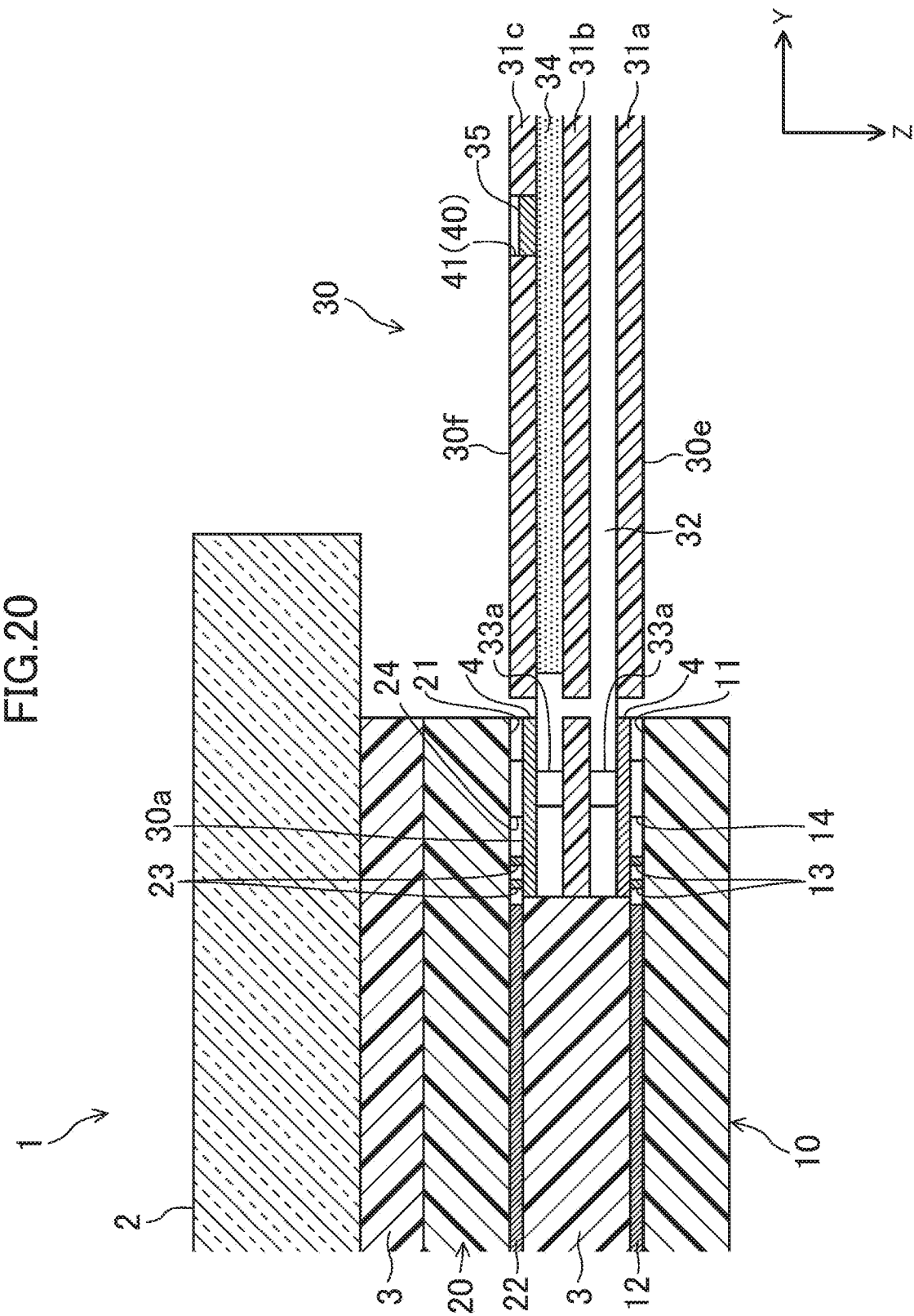
FIG. 20 is a view corresponding to FIG. 6, illustrating a cross-sectional configuration of a wiring board according to another example of the seventh variation of the first and second embodiments.

In each of the embodiments, the touch sensor 1 includes only the first sensor board 10. However, the touch sensor 1 is not limited to this configuration. Specifically, as shown in FIG. 20, the touch sensor 1 may include first and second sensor boards 10, 20.

In this variation, the first sensor board 10 is disposed such that a surface thereof opposite to the first sensor surface 11 faces a back surface of the cover member 2. Further, the first sensor electrode 12 is a reception electrode. The other configurations of the first sensor board 10 are the same as those in the first embodiment, and therefore, detailed description thereof will be omitted.

The second sensor board 20 is stacked on the first sensor board 10 via, for example, an optically transparent adhesive sheet. Specifically, the second sensor board 20 includes a second sensor surface 21 that is stacked on the first sensor board 10 so as to face the first sensor surface 11. On the second sensor surface 21, a second sensor electrode 22, routing lines 23, 23, ... and second sensor terminals 24, 24 ... are formed. The second sensor electrode 22 is a transmission electrode. Specifically, the first sensor electrode 12 and the second sensor electrode 22 are configured to be capacitively coupled to each other. Each of the second sensor terminals 24 is formed on the outer edge of the second sensor surface 21.

The first end 30a of the wiring board 30 is mechanically connected to the second sensor board 20. Specifically, the first end 30a of the wiring board 30 is fixed to the second sensor surface 21 of the second sensor board 20 with the anisotropically electroconductive resin material 4. The ground portion 34 of the wiring board 30 is exposed on the first wiring board surface 30e. Specifically, the ground portion 34 is configured such that part thereof is exposed through each of the through holes 40 formed in the second wiring board surface 30f, as in the first and second embodiments. Note that the signal line portions 32 branch off in two different directions toward the first and the second sensor surfaces 11, 21 at the first end 30a.

Even in such a variation, the influence of static electricity on the display device 50 incorporating the touch sensor 1 may be kept from occurring, and a decrease in the mechanical strength of the wiring board 30 may be reduced, as in the first and second embodiments.

Other Embodiments

In each of the embodiments, the outline of each of the through holes is square. However, the through holes are not limited to this configuration, and various shapes such as a circular shape, an elliptical shape, and a polygonal shape may be employed. Note that, in a configuration in which the outline of each of the through holes is, for example, circular, the through holes 40, 40 adjacent to each other need only be formed such that the interval between the through holes is larger than the pore diameter of each of the through holes in the X direction.

INDUSTRIAL APPLICABILITY

The present invention is industrially applicable as a touch sensor on which a touch operation may be performed, and a display device using the touch sensor.

DESCRIPTION OF REFERENCE CHARACTERS

1: Touch sensor
2: Cover Member
10: First Sensor Board
11: First Sensor Surface
12: First Sensor Electrode
14: First Sensor Terminal
20: Second Sensor Board 21: Second Sensor Surface
22: Second Sensor Electrode
24: Second Sensor Terminal
30: Wiring Board
30A: First End
30B: Second End
30c: First Outer Edge Portion
30d: Second Outer Edge Portion
30e: First Wiring Board Surface
30f: Second Wiring Board Surface
31a to 31c: Insulating Layer
32: Signal Line Portion
33a: First Wiring Terminal
33b: Second Wiring Terminal
34: Ground Portion
35: Electroconductive Layer
40: Through Hole
50: Display Device
51: Device Body
52: Opening
53: Display
54: Mounting Board
B: Interval
C: Gap
L1 to L3: Line Segment

The invention claimed is:

1. A touch sensor comprising:
a first sensor board having a first sensor electrode and a first sensor terminal electrically connected to the first sensor electrode, and
a wiring board having a first end mechanically connected to the first sensor board, a signal line portion electrically connected to the first sensor terminal at the first end, a ground portion electrically insulated from the signal line portion, and an insulating layer covering the ground portion, wherein
the insulating layer has a plurality of through holes passing through the insulating layer in a thickness direction of the wiring board and exposing the ground portion therethrough,
the plurality of through holes are arranged at intervals, and
a line segment connecting at least two of the plurality of through holes intersects the signal line portion.

2. The touch sensor of claim 1, wherein
the signal line portion includes a first wiring terminal electrically connected to the first sensor terminal at the first end, and a second wiring terminal electrically connected to the first wiring terminal,
the wiring board has a second end on which the second wiring terminal is disposed, a first outer edge portion extending from the first end to the second end, and a second outer edge portion facing the first outer edge portion with an intervention of the signal line portion and extending from the first edge portion to the second edge portion, and
the plurality of through holes include a first through hole located between the first outer edge portion and the second outer edge portion, a second through hole located closer to the first outer edge portion than the first through hole, and a third through hole located closer to the second outer edge portion than the first through hole.

3. The touch sensor of claim 2, wherein
the first through hole is located on a line segment connecting the second through hole and the third through hole.

4. The touch sensor of claim 2, wherein
the first through hole is located closer to the first end than a line segment connecting the second through hole and the third through hole.

5. The touch sensor of claim 4, wherein
the line segment intersects the signal line portion and extends in a direction from the first outer edge portion toward the second outer edge portion,
and a plurality of first through holes are located between the second through hole and the third through hole, and are disposed on both the first end side and the second end side of the line segment.

6. The touch sensor of claim 2, wherein
the first through hole is located closer to the second end than a line segment connecting the second through hole and the third through hole.

7. The touch sensor of claim 1, wherein
the signal line portion includes a first wiring terminal electrically connected to the first sensor terminal at the first end, and a second wiring terminal electrically connected to the first wiring terminal,
the wiring board has a second end on which the second wiring terminal is disposed, a first outer edge portion extending from the first end to the second end, and a second outer edge portion facing the first outer edge portion with an intervention of the signal line portion and extending from the first edge portion to the second edge portion, and
the insulating layer has a fifth through hole that is located closer to the first outer edge portion than the plurality of through holes and passes through the insulating layer in the thickness direction of the wiring board, and a sixth through hole that is located closer to the second outer edge portion than the plurality of through holes and passes through the insulating layer in the thickness direction of the wiring board.

8. The touch sensor of claim 7, wherein
the plurality of through holes are located on a line segment connecting the fifth through hole and the sixth through hole.

9. The touch sensor of claim 7, wherein
the plurality of through holes are located closer to the first end than a line segment connecting the fifth through hole and the sixth through hole.

10. The touch sensor of claim 7, wherein
the plurality of through holes are located closer to the second end than a line segment connecting the fifth through hole and the sixth through hole.

11. The touch sensor of claim 1, wherein
the wiring board further has an electroconductive layer that is stacked in the plurality of through holes and electrically connected to the ground portion,
a material of the ground portion includes copper, and
a material of the electroconductive layer includes gold.

12. The touch sensor of claim 1, wherein
the wiring board further has an electroconductive layer that covers part of the insulating layer and is electrically connected to the ground portion.

13. The touch sensor of claim 12, wherein
the electroconductive layer is configured to cover part of the insulating layer with the electroconductive layer being across the adjacent through holes.

14. The touch sensor of claim 1, wherein
the signal line portion includes a first wiring terminal electrically connected to the first sensor terminal at the first end, and a second wiring terminal electrically connected to the first wiring terminal, the wiring board has a second end on which the second wiring terminal is disposed, a first outer edge portion extending from the first end to the second end, and a second outer edge portion facing the first outer edge portion with an intervention of the signal line portion and extending from the first edge portion to the second edge portion, and an interval between the plurality of through holes in a direction along a line segment connecting the through holes is larger than a pore diameter or a diagonal line of each of the plurality of through holes.

15. The touch sensor of claim 1, wherein the first sensor board further has a first sensor surface on which the first sensor terminal is formed, the wiring board further has a first wiring board surface at least partially located near the first sensor surface, and a second wiring board surface that is a surface opposite to the first wiring board surface, and the ground portion is exposed on the second wiring board surface.

16. The touch sensor of claim 1, wherein the first sensor board further has a first sensor surface on which the first sensor terminal is formed, and the wiring board further has a first wiring board surface at least partially facing the first sensor surface, and the ground portion is exposed on the first wiring board surface.

17. The touch sensor of claim 1, further comprising a cover member covering the first sensor board, wherein an outline of the cover member is larger than that of the first sensor board, and the plurality of through holes are located between the outline of the cover member and the outline of the first sensor board.

18. The touch sensor of claim 1, further comprising a second sensor board having a second sensor electrode capacitively coupled to the first sensor electrode, a second sensor terminal electrically connected to the second sensor electrode and the signal line portion, and a second sensor surface on which the second sensor terminal is formed, and the second sensor board being mechanically connected to the first end, wherein the first sensor board further has a first sensor surface on which the first sensor terminal is formed, and the wiring board has a first wiring board surface at least partially facing the first sensor surface, and a second wiring board surface opposite to the first wiring board surface and facing the second sensor surface, and the ground portion is exposed on the first wiring board surface.

19. The touch sensor of claim 18, wherein the first sensor electrode is a reception electrode, and the second sensor electrode is a transmission electrode.

20. A display device comprising:

the touch sensor of claim 1, a display facing the first sensor board, and a mounting board disposed in a direction from the touch sensor toward the display, wherein the signal line portion includes a first wiring terminal electrically connected to the first sensor terminal at the first end, and a second wiring terminal electrically connected to the first wiring terminal and electrically connected to the mounting board, the wiring board has a first wiring board surface at least partially facing a space between the touch sensor and the mounting board, and a second wiring board surface that is a surface opposite to the first wiring board surface, and the plurality of exposed portions are formed on the second wiring board surface.

* * * * *